United States Patent
Kim et al.

[11] Patent Number: 5,859,409
[45] Date of Patent: Jan. 12, 1999

[54] OVEN FOR TESTING PERIPHERAL STORAGE DEVICES

[75] Inventors: Jin-euk Kim, Bupyeong-gu; Dae-geun Yoo, Gumi; Young-bog Seong, Chilgok-gun, all of Rep. of Korea

[73] Assignees: SamSung Electronics Co., Ltd., Suwon; Jeio Tech Co., Ltd., Kyungki-do, both of Rep. of Korea

[21] Appl. No.: 931,128

[22] Filed: Sep. 16, 1997

[30] Foreign Application Priority Data

Sep. 16, 1996 [KR] Rep. of Korea .................. 1996 40212

[51] Int. Cl.⁶ .......................... G01R 31/02; G01R 33/12; F27D 7/04
[52] U.S. Cl. .......................... 219/400; 219/394; 219/428; 324/760
[58] Field of Search .................. 219/385, 386, 219/400, 394, 428; 324/158.1, 212, 760

[56] References Cited

U.S. PATENT DOCUMENTS

| 4,455,478 | 6/1984 | Guibert | 219/400 |
|---|---|---|---|
| 4,967,155 | 10/1990 | Magnuson . | |
| 5,021,733 | 6/1991 | Ebihara et al. . | |
| 5,103,168 | 4/1992 | Fuoco . | |
| 5,184,068 | 2/1993 | Twigg et al. . | |
| 5,359,285 | 10/1994 | Hashinaga et al. | 324/158.1 |
| 5,486,681 | 1/1996 | Dagnac et al. | 219/400 |
| 5,574,384 | 11/1996 | Oi | 324/760 |
| 5,582,235 | 12/1996 | Hamilton et al. . | |

FOREIGN PATENT DOCUMENTS

| 472862 | 4/1951 | Canada | 219/400 |
|---|---|---|---|

*Primary Examiner*—Teresa J. Walberg
*Assistant Examiner*—J. Pelham
*Attorney, Agent, or Firm*—Robert E. Bushnell, Esq.

[57] ABSTRACT

An oven for testing the quality of a peripheral storage devices including an aging room, configured to receive a plurality of peripheral storage devices to be tested therein, with upper and lower mixing rooms in fluid communication therewith. A support duct, having a circulation cavity, is in fluid communication with the upper and lower mixing rooms and has a plurality of discharge openings to the circulation cavity. Ducts draw in outside air while hot air is discharged.

16 Claims, 2 Drawing Sheets

OVEN FOR TESTING PERIPHERAL STORAGE DEVICES

CLAIM OF PRIORITY

This application makes reference to, incorporates the same herein, and claims all benefits accruing under 35 U.S.C. §119 from an application entitled *Oven for Testing Peripheral Storage Device* earlier filed in the Korean Industrial Property Office on 16 Sep. 1996, and there duly assigned Ser. No. 96-40212 by that Office.

BACKGROUND OF THE INVENTION

1. Field of the Invention

The present invention relates to an ovens. More particularly, the present invention relates to ovens used during equipment testing.

2. Discussion of the Prior Art

In general, a personal computer includes peripheral storage devices, such as hard disk drives, floppy disk drives and/or CD-ROM drives. Each peripheral storage device is tested in an oven under predetermined circumstances called "aging." The testing ovens typically accommodate a plurality of closely-packed peripheral storage devices. The ovens include a hot air blower and a cold air blower. The hot air blower typically is composed of a heater and a blower which maintain a uniform preset temperature inside the oven.

Exemplars of the prior art include the patent to Ebihara et al., U.S. Pat. No. 5,021,733, entitled *Burn-In Apparatus,* describes a burn-in board having an interior section path into which hot air is drown, and a plurality of protrusions for maintaining a semiconductor device.

The patent to Magnuson, U.S. Pat. No. 4,967,155, entitled *Environmentally Controlled Media Defect Detection System For Winchester Disk Drives,* describes a main chamber with an upper chamber and a lower chamber. The upper chamber has an intake fan. A duct dries air from the upper chamber and delivers the air via a discharge vent into the aging chamber. The lower chamber is include communication with the main chamber via a gestate.

The patent to Hamilton et al., U.S. Pat. No. 5,582,235, entitled *Temperature Regulator For Burn-In Board Components,* describes a plurality of burn-in board and a blower which forces the gas to flow through nozzles.

The patent to Twigg et al., U.S. Pat. No. 5,184,068, entitled *Electronic Device Test Handler,* describes a tray which receive a plurality of electronic components. Referring to FIG. 5, a group of trays maintained to vertical beams 70a and 70b as shown in FIG. 1, are introduced into an aging chamber at back of the device.

The patent to Fuoco, U.S. Pat. No. 5,103,168, entitled *Stress Testing Equipment With An Integral Cooling Plenum,* describes a carrier on which components are mounted prior to introduction of the carrier into an oven. Referring to FIG. 1, the devices divided into three sections: a high temperature section 4, a moderate temperature section 6 and a ambient temperature section 8.

I have found that when a plurality of peripheral storage devices are closely packed in the oven, it is difficult to maintain the oven temperature accurately. When the oven temperature is not distributed uniformly, peripheral storage device testing is not reliable from device to device.

SUMMARY OF THE INVENTION

An object of the present invention is to provide an improved oven for aging peripheral storage devices.

Another object is to provide an oven for testing peripheral storage devices which regulates the temperature accurately inside the oven by providing uniformly distributed heated air therein.

Still another object is to provide an oven for aging peripheral devices that enhances the reliability and accuracy of testing procedures conducted.

The present oven for testing peripheral storage devices includes an aging room in which a plurality of peripheral storage devices to be tested may be installed. A support duct installed in the aging room supports the peripheral storage devices and has a circulation cavity fostering communication between the upper mixing room, the lower mixing room and the aging room, via a plurality of discharge openings. A duct, having intake openings for drawing in outside air, supplies same to the upper mixing room and/or the lower mixing room. A hot air blower, including a heater, blows air into the upper and lower mixing rooms through the circulation cavity of the support duct. A blower in the upper mixing room and/or lower mixing room discharges air from the upper and/or the lower mixing rooms to the outside through discharge slots. Outside air is drawn in through the intake opening on the duct due to the vacuum caused by the discharge of air.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
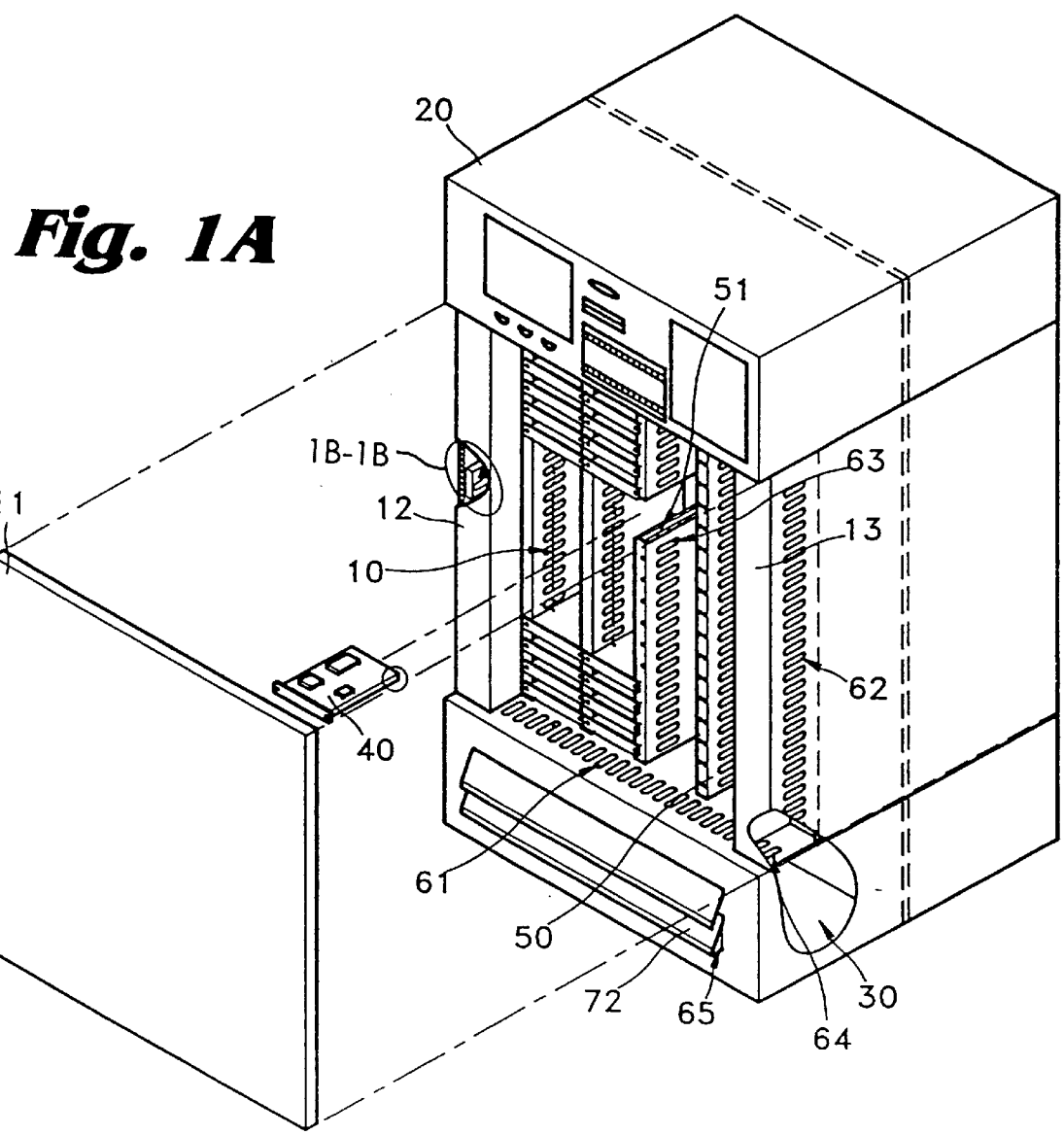
FIG. 1A is a top right front exploded perspective view of the present oven for testing peripheral storage devices.

Referring to FIG. 1A, the present oven for testing peripheral storage devices includes an aging room 10, an upper mixing room 20 and a lower mixing room 30. A glass door 11 is installed in front of the aging room 10 so that the inside of the aging room may be observed. A plurality of through holes 61 are formed between the aging room 10 and the upper mixing room 20, and the aging room 10 and the lower mixing room 30. A plurality of support ducts 50 are mounted between the upper and the lower mixing rooms 20 and 30, to which a multiplicity of peripheral storage devices 40 may be installed. Each support duct 50 has a circulation cavity 51 in fluid communication with the upper and the lower mixing rooms 20 and 30. Also, the circulation cavity 51 is in communication with the aging room 10 through a plurality of discharge openings 63.

Figure 1B:
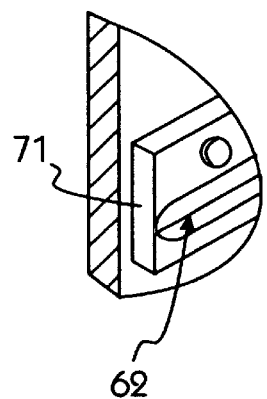
FIG. 1B is an enlarged top right front perspective view of structural aspects of the oven of FIG. 1A.

Referring also to FIG. 1B, a left duct 12 and a right duct 13 are installed to the left and the right of the aging room 10, respectively. The left duct 12 and the right duct 13 each have an intake opening 62 through which outside air is introduced and supplied to opening 64, which is connected to the upper mixing room 20 and/or the lower mixing room 30.

Figure 2:
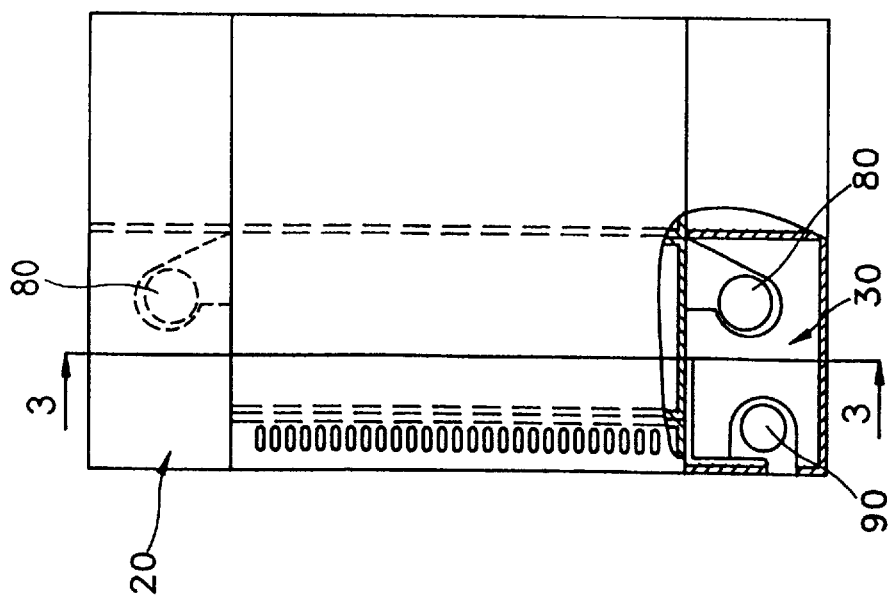
FIG. 2 is a right side elevational view, partially in cross section, of the oven of FIG. 1A.

Referring also to FIG. 2, a blower 80 is installed in the lower mixing room 30. An additional blower (not shown) may be installed in the upper mixing room 30. The blower 80, having a heater (not shown), heats the air in the lower mixing room 30 (and possibly the upper mixing room 20) and blows the heated air into the circulation cavity 51 of the support duct 50, drawing air from the outside through the left and the right ducts 12 and 13. The blower 90 discharges the air in the lower mixing room 30 to the outside through a discharge slot 65. This convention exploits conventional thermodynamic principles. Because heated air tends to be lighter than cooler air, it tends to rise. Therefore, it is preferred that the blower 80, which includes a heater for heating the air to be introduced into the aging room, be located in the lower mixing room 30. This eases the cool placed on the slower, because the heated air naturally is inclined to travel upwardly, thus the blower does not have to work as hard to achieve the desired distribution of the air heated. Further, since relatively cooler air tends to sink with respect to the heated air, it is preferable to discharge air from the lower mixing room, which would naturally contain the cooler air in the oven. Accordingly, the blower 90 draws the cool air from the lower mixing room 30 and discharges some through the vent 65.

Another discharge slot may be provided in the upper mixing room 20 when another blower is installed therein.

A first valve 71 is installed in the intake opening 62 to regulate the intake of outside air therethrough when the blower 90 discharges air from the lower mixing room 30. That is, the first valve 71 opens only when the pressure in the left and the right ducts 12 and 13 is low.

In the discharge slot 65 of the lower mixing room 30, a second valve 72 is installed which opens only when the blower 90 discharges air from the upper and/or the lower mixing rooms 20 and 30. That is, the second valve 72 opens by pressure generated by the blower 90.

Figure 3:
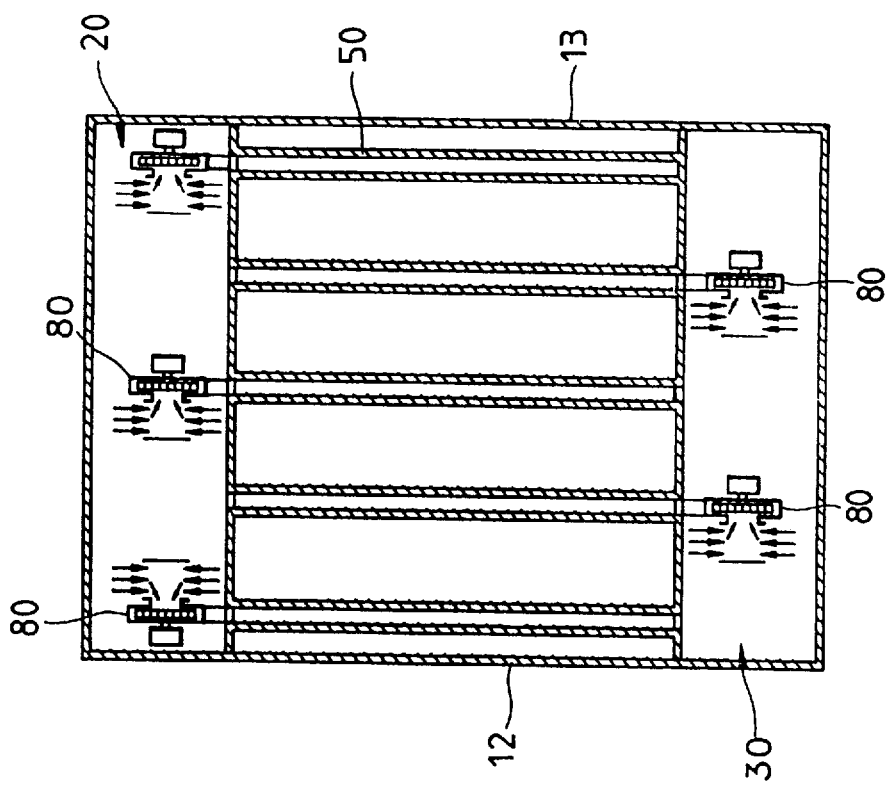
FIG. 3 is a cross sectional detail view, drawn along line 3—3 in FIG. 2.

Referring to FIG. 3, a hot air blower 80 is installed at one end of each support duct 50, in an alternating fashion, in either the upper or lower mixing rooms 20 and 30. This configuration promotes uniform air circulation around the peripheral storage devices closely packed between the support ducts 50. Although location of the blower 80 including the heater in the lower mixing room may be preferred from a thermodynamic stand point, alternating the location of blower 80, with or without heaters, is preferred from a heat distribution stand point. By alternating the locations of the blowers in the upper and lower mixing room, warmer air, which naturally rises to the top of the oven, is compelled to mix with cooler air, which naturally falls to the bottom of the oven. This compelled mixing prevents pockets of warm and cool air from forming in the oven during peripheral device testing. If such pockets were allowed to develop, some of the device being tested in the oven would tested as different temperatures than other devices in the oven. Non-uniform test conditions impart the reliability and accuracy of the testing procedures.

In operation, the peripheral storage devices 40 to be tested are installed between the support ducts 50 in the oven and the glass door 11 is closed. A controller (not shown) operates the hot air blower 80 to increase the temperature of the aging room 10 to a preset temperature. The hot air blower 80 heats the air in the upper and the lower mixing rooms 20 and 30 and blows the heated air through the circulation cavity 51 of the support duct 50. The heated air flows into the aging room 10 via the discharge opening 63. The air flowing in the aging room 10 circulates through the oven by entering in the upper and the lower mixing rooms 20 and 30 through the through hole 61. Since the intake opening 62 and the discharge slot 65 are blocked by the first valve 71 and the second valve 72, respectively, outside air is prevented from freely entering into the aging room 10.

A controller (not shown) monitors the temperature of the aging room 10. When the temperature is detected to be appropriate, a predetermined test is performed on the peripheral storage devices 40. The temperature of the aging room 10 is controlled by the controller regulating the current of the heater (not shown) installed in the hot air blower 80 or driving/halting the blower 90.

When the blower 90, driven by the controller, discharges air from the lower mixing room 30 through the discharge slot 65, the second valve 72 is kept open. When the air of the lower mixing room 30 is discharged, the pressure in the left and right ducts 12 and 13 becomes low and accordingly the first valve 71 opens, the outside air flowing in through the intake opening 62 to the lower mixing room 30 through the supply opening 64 to mix with the heated air. The mixed air is supplied to the aging room 10 through the circulation cavity 51 and the discharge opening 63.

As described above, according to the present invention, it is possible to maintain a uniform temperature in the oven by evenly supplying the heated air throughout the oven where a plurality of peripheral storage devices are closely packed. Also, the temperature in the oven can be accurately regurated by controlling the blower, relative to the conventional technology.

The present invention is not limited to the embodiment described above, rather encompasses all embodiments falling within the scope of the appended claims.

What is claimed is:

1. An apparatus for aging a peripheral storage device, comprising:

an aging room;

an upper mixing room and a lower mixing room mounted on an upper portion and a lower portion of said aging room, respectively, said upper mixing room and said lower mixing being in fluid communication with said aging room;

a support duct, configured to receive the peripheral storage device, said support duct having a circulation cavity in fluid communication with said upper mixing room, said lower mixing room and said aging room;

a supply duct selectively supplying outside air to one or both of said upper mixing room and said lower mixing room;

a first blower, including a heater, mounted in one of said upper mixing room and said lower mixing room, urging air into said circulation cavity; and a second blower installed in said lower mixing room, discharging air from said lower mixing room.

2. The apparatus of claim 1, further comprised of said second blower drawing outside air into said supply duct.

3. The apparatus of claim 1, comprising an additional blower disposed with said first blower to form a plurality of first blowers and a like number of support ducts, a first group of said first blowers being mounted in said upper mixing room, the remaining group of said first blowers being mounted in said lower mixing room.

4. The apparatus of claim 3, wherein:

said support ducts generally are aligned, each said support duct having a first end and a second end in fluid communication with said circulation cavity; and a first one of said first blowers urges air into said first end and a next one of said first blowers urges air into said second end.

5. The apparatus of claim 1, including a first valve conducting air into said apparatus.

6. The apparatus of claim 5, further comprised of said first valve conducting air to said first blower.

7. The apparatus of claim 5, wherein said first valve permits flow only in one direction.

8. The apparatus of claim 5, further comprised of said first valve receiving air through an intake slot.

9. The apparatus of claim 1, including a second valve discharging air from said apparatus.

10. The apparatus of claim 9, further comprised of said second valve discharging air from said second blower.

11. The apparatus of claim 9, further comprised of said second valve permitting flow in only one direction.

12. The apparatus of claim 9, further comprised of said second valve discharging air through a discharge slot.

13. The apparatus of claim 1, comprising a door mounted on said aging room permitting visual inspection into an interior of said aging room.

14. An apparatus for aging a peripheral storage device, comprising:

an aging room;

an upper mixing room and a lower mixing room mounted on an upper portion and a lower portion of said aging room, respectively, said upper mixing room and said lower mixing being in fluid communication with said aging room;

a plurality of support ducts, each configured to receive the peripheral storage device, and each comprising a circulation cavity in fluid communication with said upper mixing room, said lower mixing room and said aging room;

a supply duct supplying outside air to one of, or both of, said upper mixing room and said lower mixing room;

a first valve regulating intake of air into said supply duct;

a second valve regulating discharge of air from said lower mixing room;

a like number of first blowers as said support ducts, a first group of said first blowers being mounted in said upper mixing room, the remaining group of said first blowers being mounted in said lower mixing room, one of said first blowers comprising a heater and all of said first blowers urging air into said circulation cavity; and a second blower installed in said lower mixing room, drawing outside air into said supply duct and discharging air from said lower mixing room.

15. The apparatus of claim 14, comprising:

said support ducts being aligned, each said support duct having a first end and a second end in fluid communication with said circulation cavity; and a first one of said first blowers being connected to urge air into said first end and a next one of said first blowers being connected to urge air into said second end.

16. The apparatus of claim 14, comprising a door mounted on said aging room permiting visual inspection of an interior of said aging room.

* * * * *